United States Patent [19]
Kawashima

[11] Patent Number: 5,334,900
[45] Date of Patent: Aug. 2, 1994

[54] TORSIONAL QUARTZ CRYSTAL RESONATOR

[75] Inventor: Hirofumi Kawashima, Sendai, Japan

[73] Assignee: Seiko Electronic Components Ltd., Japan

[21] Appl. No.: 110,628

[22] Filed: Aug. 23, 1993

Related U.S. Application Data

[63] Continuation of Ser. No. 886,330, May 20, 1992, abandoned.

[30] Foreign Application Priority Data

| Dec. 19, 1990 | [JP] | Japan | 2-403751 |
| May 27, 1991 | [JP] | Japan | 3-121487 |
| May 27, 1991 | [JP] | Japan | 3-121488 |
| Sep. 26, 1991 | [JP] | Japan | 3-247877 |
| Sep. 27, 1991 | [JP] | Japan | 3-249838 |

[51] Int. Cl.⁵ .................................................. H01L 41/08
[52] U.S. Cl. .................................. 310/370; 310/361; 310/333
[58] Field of Search ............... 310/333, 361, 367, 368, 310/370

[56] References Cited

U.S. PATENT DOCUMENTS

| 3,375,379 | 3/1968 | Royer | 310/361 |
| 3,969,641 | 7/1976 | Oguchi | 310/361 |
| 4,437,773 | 3/1984 | Dinger et al. | 310/361 X |
| 4,450,378 | 5/1984 | Hermann | 310/361 |
| 4,486,682 | 12/1984 | Nakazawa | 310/361 |
| 4,499,395 | 2/1985 | Kahan | 310/361 |
| 4,503,353 | 3/1985 | Hermann | 310/361 |
| 4,540,909 | 9/1985 | Takahashi et al. | 310/370 |
| 4,592,663 | 6/1986 | Eer Nisse et al. | 310/370 X |
| 4,772,130 | 9/1988 | Ueda et al. | 310/361 X |
| 5,156,460 | 10/1992 | Norling et al. | 310/333 |

FOREIGN PATENT DOCUMENTS

0365268 4/1990 European Pat. Off. .
2124022 2/1984 United Kingdom .

*Primary Examiner*—Mark O. Budd
*Attorney, Agent, or Firm*—Bruce L. Adams; Van C. Wilks

[57] ABSTRACT

A torsional quartz crystal resonator has a specific cut type resulting in improved frequency temperature behavior. The cut type is defined by rotating a Z plate quartz crystal around an x-axis at an angle $\phi$ in the range of 0° through 30° and by further rotating the plate around a z'-axis at another angle $\theta$ in the range of $-20°$ through $-10°$ or $+10°$ through $+20°$. The resonator has a thickness $z_0$ and a width $x_0$ determined such that a thickness-to-width ratio $Rzx = z_0/x_0$ is set within the range of 0.6 through 1.1 to make the first order temperature coefficient substantially zero in combination with the optimum angles $\phi$ and $\theta$. Excitation electrodes are disposed on major faces of the resonator normal to the z' axis, and a connecting electrode is disposed on a side face of the resonator to reduce the series resistance $R_1$.

14 Claims, 6 Drawing Sheets

TORSIONAL QUARTZ CRYSTAL RESONATOR

This is a continuation of application Ser. No. 886,330 filed May 20, 1992, now abandoned.

BACKGROUND OF THE INVENTION

1. Field of the Invention

The present invention relates to a torsional quartz crystal resonator. More specifically, the invention relates to the cut angle, thickness-to-width ratio, shape and excitation electrode structure of a torsional quartz crystal resonator of the specific cut type referred to as "TT cut" in this description. The present invention particularly relates to the torsional quartz crystal resonator of the type suitable for a clock signal source in various portable devices such as a wrist watch, a pager, an IC card and a vehicle wireless communication implement, in which the resonator is required to have a high level of accuracy, a compact size, good resistance to shock and a reasonable price.

2. Description of the Prior Art

There has been used in the prior art a flexural mode quartz crystal resonator of a tuning fork type, and a length extensional mode quartz crystal resonator in a frequency band of 200 kHz–600 kHz. However, the flexural mode quartz crystal resonator of the tuning fork type utilizes an overtone, and hence formation of electrodes is complicated and a serious loss of vibrational energy is caused through lead wires, etc. Consequently, this type of resonator has the drawback of a relatively high series resistance $R_1$. On the other hand, the extensional mode quartz crystal resonator has an oscillating frequency which is reciprocal to a length of a vibrational arm of the resonator. Therefore, the resonator is enlarged in the relatively low frequency range below 600 kHz, thereby causing the drawback that the ability scale-down the resonator in size is difficult. In view of these drawbacks, there has long been desired a quartz crystal resonator of a new cut type which would feature an oscillating frequency in the range of 200 kHz–600 kHz, a micronized compact size, a zero temperature coefficient, and an easy chemical etching process.

SUMMARY OF THE INVENTION

An object of the invention is to provide a torsional quartz crystal resonator of a new cut type, defined by rotating a Z plate quartz crystal around the x-axis and further rotating the quartz crystal around the z'-axis.

Another object of the invention is to set an optimum range of the thickness-to-width ratio in a torsional quartz crystal resonator resulting in good frequency temperature behavior. Namely, the frequency temperature behavior can be improved by optimally setting the ratio of the thickness to the width of the resonator.

A further object of the invention is to provide an excitation electrode structure having a reduced series resistance. Namely, the series resistance can be reduced by arranging the excitation electrode on a face of the resonator piece, normal to the z'-axis, and by arranging a connection electrode on a side face of a vibrational portion of the resonator.

A still further object of the invention is to provide a torsional quartz crystal resonator having a specific configuration effective to reduce a loss of vibration energy.

DETAILED DESCRIPTION OF PREFERRED EMBODIMENTS

Figure 1:
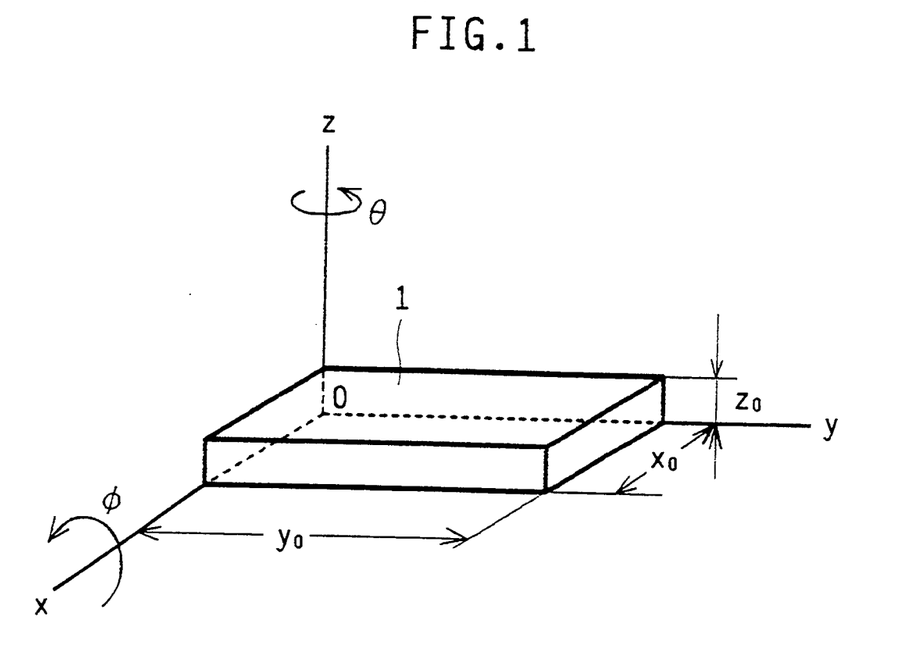
FIG. 1 is a schematic diagram showing the coordinate system of the inventive torsional quartz crystal resonator.

FIG. 1 shows the coordinate system of the inventive torsional quartz crystal resonator. The coordinate system 0-xyz is comprised of an origin point 0, an electrical axis x, a mechanical axis y and an optical axis z. An original torsional quartz crystal resonator 1 has a thickness $z_0$, a width $x_0$ and a length $y_0$ and a torsional moment around the y axis. This original resonator is defined along a Z plate quartz crystal which is normal to the z axis. Then, referring to FIG. 6A, the original resonator is rotated around the x axis by an angle $\phi$ in the range from $-90°$ to $+90°$, where a counterclockwise direction is denoted by a plus sign, such that the rotated resonator has a new z axis, i.e., z' axis. Further, the resonator is rotated around the z' axis by another angle $\theta$ in the range of $-80°$ through $-10°$ or in the range of $10°$ through $80°$, hereinafter referred to in abbreviated form as $\pm(10°$ through $80°)$, thereby defining the inventive resonator of a new cut which is hereinafter referred to as "TT cut".

Figure 2A:
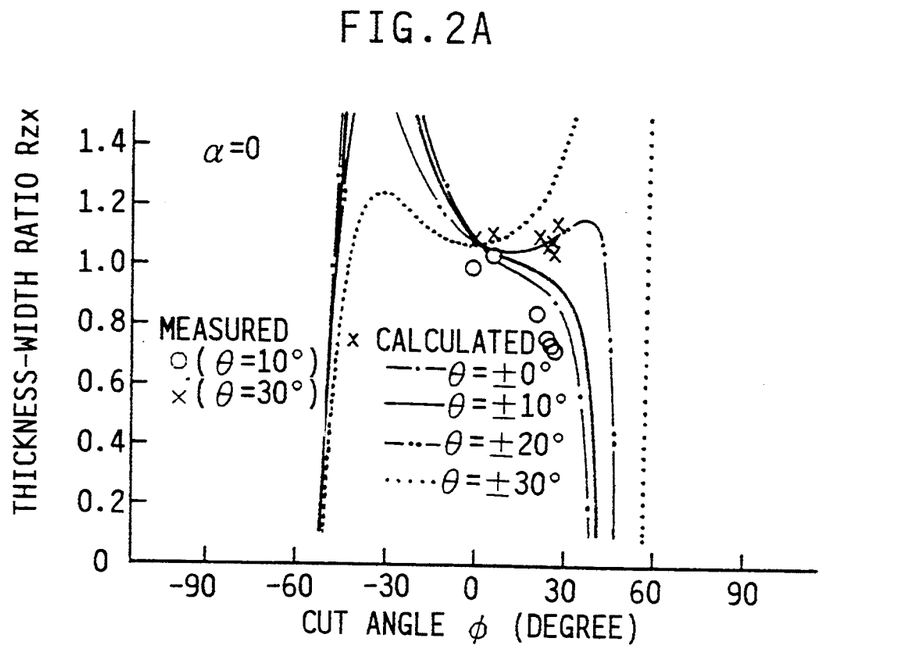
FIG. 2A is a graph showing the relation between cut angles $\phi$, $\theta$ and a thickness-to-width ratio Rzx of the inventive torsional quartz crystal resonator in which the first order temperature coefficient $\alpha$ is set to zero.
Figure 2B:
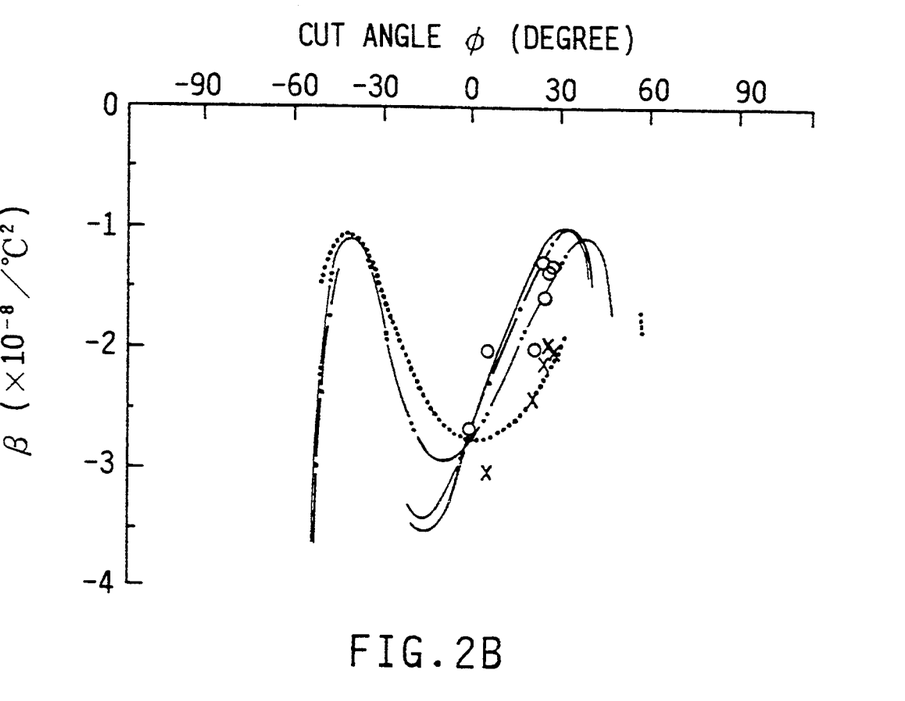
FIG. 2B is a graph showing the relation between the second order temperature coefficient $\beta$ and the cut angle $\phi$ in the FIG. 2A resonator.

The cut angles $\phi$, $\theta$ and the thickness-to-width ratio $Rzx = z_0/x_0$ are optimally determined to set the first order temperature coefficient $\alpha$ to zero. FIG. 2A shows the relation between the cut angles $\phi$, $\theta$ and the thickness-to-width ratio Rzx, which are set to establish the condition that the first order temperature coefficient $\alpha$ equals zero in the inventive torsional quartz crystal resonator. FIG. 2B shows the relation between the second order temperature coefficient $\beta$ and the cut angle $\phi$ under the condition $\alpha=0$. These graphs indicate calculated values while the cut angle $\theta$ is set to 0°, ±10°, ±20° and ±30° as a parameter, and measured values where the cut angle $\theta$ is fixed to ±10° and ±30°. As understood from the FIG. 2A graph, the condition $\alpha=0$ can be established by suitably selecting the thickness-to-width ratio Rzx while the cut angle $\phi$ ranges from −50° through +60° when $\theta=\pm(0°$ through 30°). Further, as seen in FIG. 2B, the absolute value of $\beta$ takes a minimum level around $\phi=30°$ when the cut angle $\theta$ is set to ±10°. For example, while $\alpha=0$ is held when $\phi=28°$ and $\theta=\pm10°$, the calculated value of $\beta$ is $-1.16\times10^{-8}/°C.^2$ and the measured value of $\beta$ is $-1.29\times10^{-8}/°C.^2$ with respect to the resonator of the tuning fork type. The absolute value of the calculated and measured $\beta$ is significantly smaller than that of the flexural mode quartz crystal resonator ($\beta=-3.8\times10^{-8}/°C.^2$) by about one-third. Further, the condition $\alpha=0$ is held at $\phi=-42°$ and $\theta=\pm30°$, while the calculated value of $\beta$ is $-1.06\times10^8/°C.^2$ and the measured value of $\beta$ is $-1.22\times10^{-8}/°C.^2$. In this case, the absolute value of $\beta$ can be significantly reduced. In general, the condition $\alpha=0$ is obtained in the range of $\phi=-50°$ through +60° by suitably setting the other cut angle $\theta$ and the thickness-to-width ratio Rzx, while the value of $\beta$ is reduced in the range of $-1.2\times10^{-8}/°C.^2$ through $-3.7\times10^{-8}/°C.^2$. Since the absolute value of $\beta$ can be made small, there can be obtained a torsional quartz crystal resonator exhibiting excellent frequency temperature behavior.

Figure 3A:
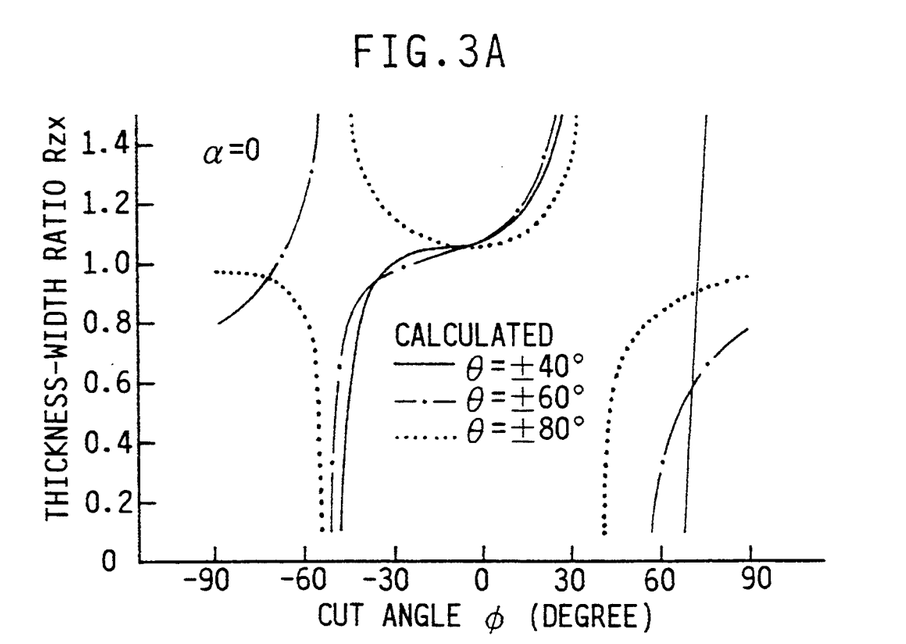
FIG. 3A is another graph showing the relation between the cut angles $\phi$, $\theta$ and the thickness-to-width ratio Rzx while the first order temperature coefficient $\alpha$ is set to zero.
Figure 3B:
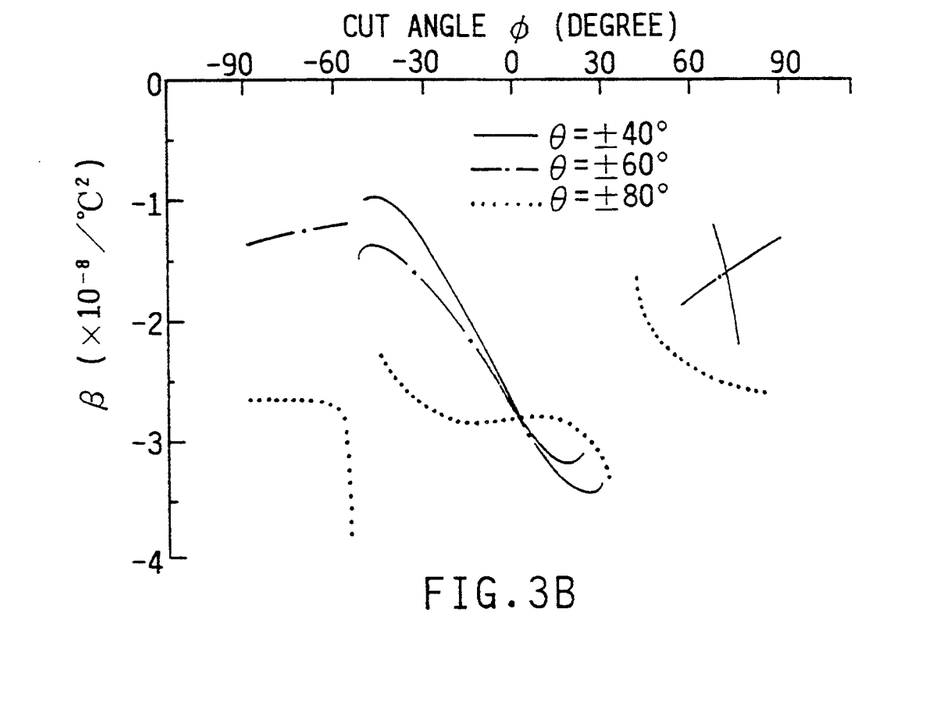
FIG. 3B is another graph showing the relation between the second order temperature coefficient $\beta$ and the cut angle $\phi$ in the FIG. 3A resonator.

FIGS. 3A and 3B show the similar relations as the FIGS. 2A and 2B graphs for the same torsional quartz crystal resonator of the tuning fork type, where the parametric cut angle $\theta$ is further set greater to ±40°, ±60° and ±80°. Namely, the FIG. 3A graph shows the relation between the cut angles $\phi$, $\theta$ and the thickness-to-width ratio Rzx, set to satisfy the condition $\alpha=0$. FIG. 3B shows the value of the second order temperature coefficient $\beta$ under the condition $\alpha=0$. Except for the range of around $\alpha=35°$ where the condition $\alpha=0$ is not realized, the condition $\alpha=0$ can be achieved generally in the range of $\phi=90°$ through +90° by suitably selecting the thickness-to-width ratio Rzx. Further, as seen from FIG. 3B, the value $\beta$ can take a relatively low value in the range of $-1.0\times10^{-8}/°C.^2$ through $-3.8\times10^{-8}/°C.^2$ as in the case of $\theta=\pm(0°$ through 30°), thereby obtaining a torsional quartz crystal resonator of the tuning fork type exhibiting good frequency temperature behavior.

Figure 4:
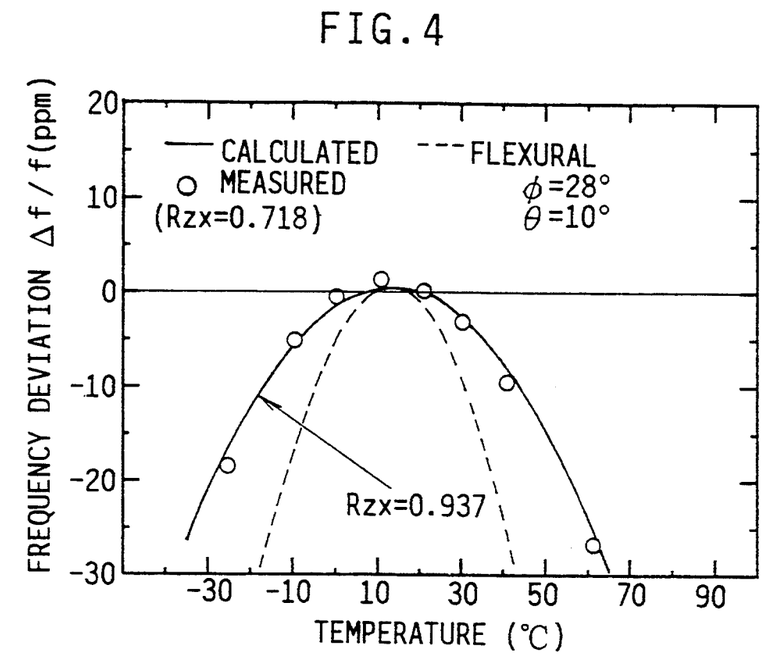
FIG. 4 is a graph showing an example of the frequency temperature behavior of the inventive torsional quartz crystal resonator of the tuning fork type.
Figure 5:
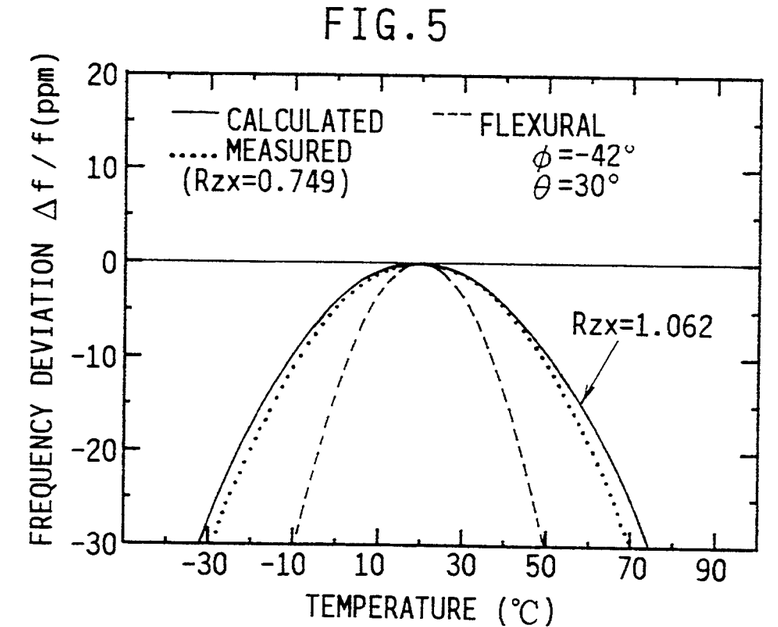
FIG. 5 is a graph showing another example of the frequency temperature behavior of the inventive torsional quartz crystal resonator of the tuning fork type.

According to the invention, the condition $\alpha=0$ can be established by selecting the cut angle $\phi$ in the range of −90° through +90°, by selecting the other cut angle $\theta$ in the range of ±(10° through 80°) and by selecting the ratio Rzx in the range of 0.1 through 1.5. Typical temperature behavior of the thus defined resonator is shown in FIGS. 4 and 5. FIG. 4 is a graph showing one example of the frequency temperature behavior of the tuning fork type inventive torsional quartz crystal resonator having cut angles of $\phi=28°$ and $\theta=10°$. The solid line curve indicates the calculated value of the frequency deviation Δf/f, and circle points indicate the measured values. On the other hand, the broken line curve indicates the frequency temperature behavior of the conventional flexural mode quartz crystal resonator. As appreciated from the FIG. 4 graph, the inventive torsional quartz crystal resonator of the tuning fork type exhibits better frequency temperature behavior.

FIG. 5 shows another example of the frequency temperature behavior of the inventive tuning fork type quartz crystal resonator having the cut angles of $\phi=-42°$ and $\theta=30°$. As in the FIG. 4 case, it is understood from the FIG. 5 graph that the inventive tuning fork type torsional quartz crystal resonator has better frequency temperature behavior as compared to the conventional flexural mode quartz crystal resonator.

Figure 6A:
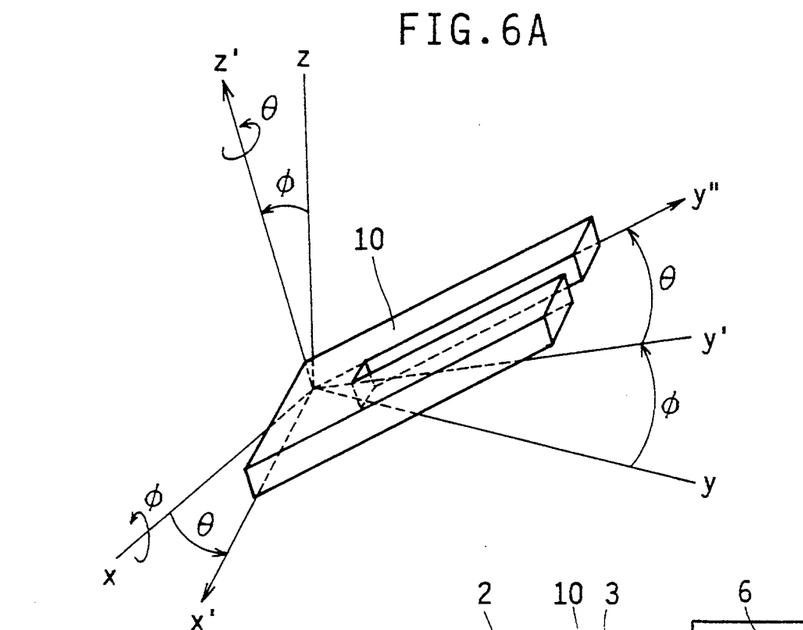
FIG. 6A is a schematic diagram showing the torsional quartz crystal resonator of the tuning fork type formed from a quartz crystal plate having cut angles $\phi$, $\theta$ determined according to the invention.
Figure 6B:
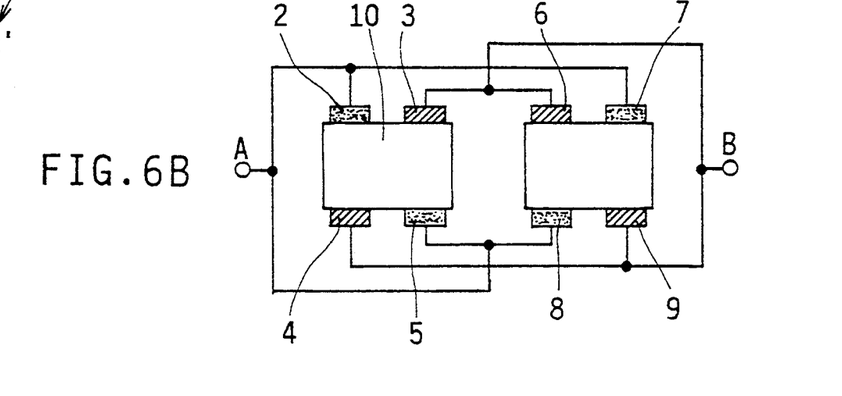
FIG. 6B is a sectional diagram showing the electrode structure of the FIG. 6A resonator.
Figure 8:
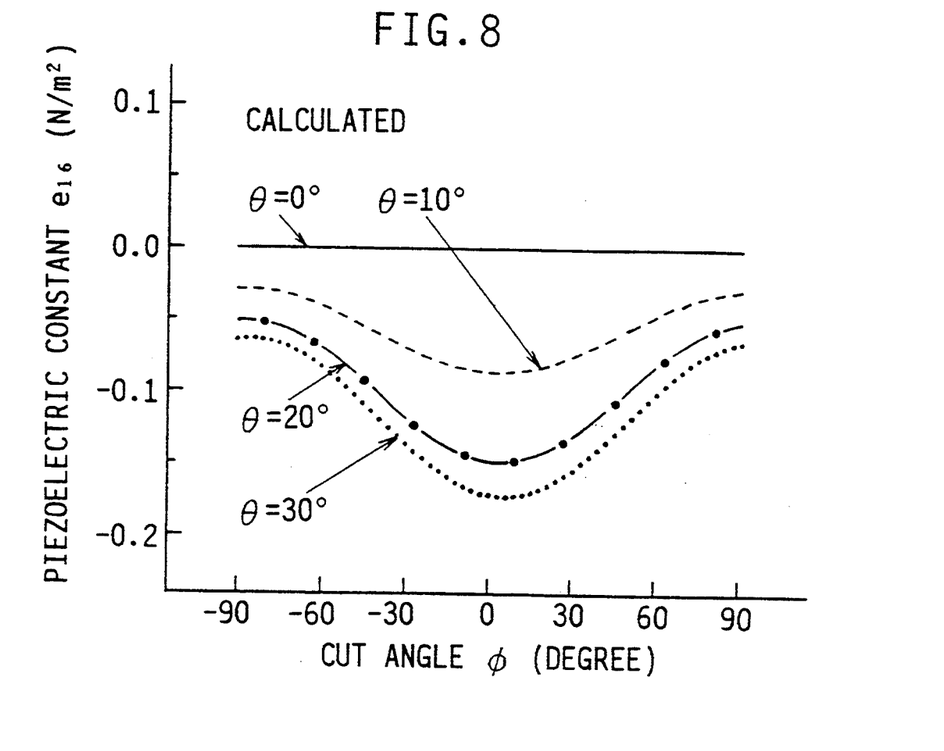
FIG. 8 is a graph showing the relation between a piezoelectric constant $e_{16}$ and the cut angle $\phi$ of the inventive resonator, where the other cut angle $\theta$ is set as a parameter.

FIG. 6A shows a perspective view of the tuning fork type torsional quartz crystal resonator formed from a quartz crystal plate having the cut angles $\phi$, $\theta$ set according to the invention. FIG. 6B shows a section of the same resonator, illustrating the electrode structure. The resonator has a pair of electrode terminals A and B. The one terminal A is connected to electrodes 2, 5, 7 and 8, and the other terminal B is connected to electrodes 3, 4, 6 and 9. In this electrode structure, the inventive torsional quartz crystal resonator 10 is excited according to a piezoelectric constant $e_{16}$. FIG. 8 shows the relation between piezoelectric constant $e_{16}$ and the cut angles $\phi$, $\theta$.

Figure 7:
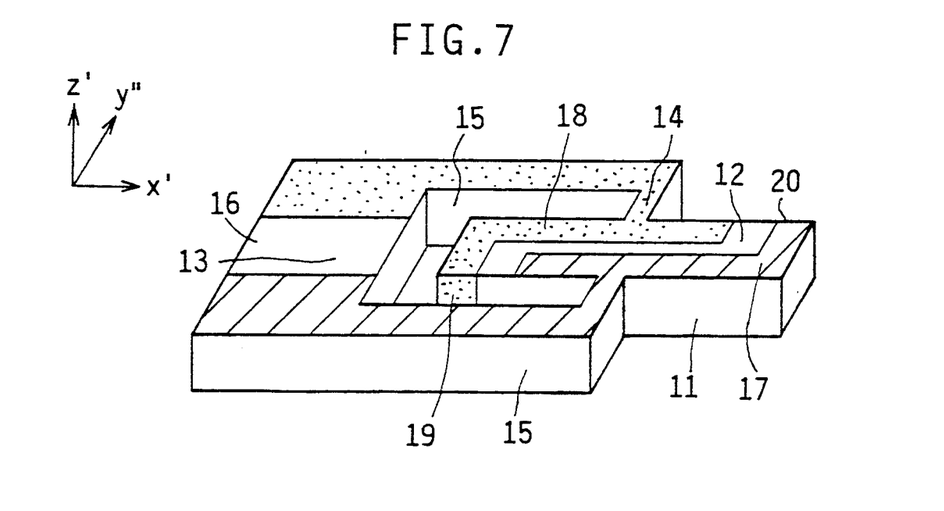
FIG. 7 is an overall view showing a shape and an excitation electrode arrangement of another embodiment of the inventive torsional quartz crystal resonator.

FIG. 7 is a perspective view showing a shape and an exciting electrode arrangement of another embodiment of the inventive torsional quartz crystal resonator. A resonator 11 is comprised of a vibrational portion 12 having exciting electrodes 17, 18, 21 and 22 (the electrodes 21 and 22 being hidden from the view) and connecting electrodes 19, 20 (the electrode 20 is hidden from the view), and a supporting portion 13 connected to the vibrational portion through a pair of bridge portions 14. The supporting portion 13 is comprised of a frame 15 coupled to the bridge portions 14 disposed at the central part of the vibrational portion 12, and coupled to a mount 16. Further, the exciting electrode 17 is formed on a top face of the vibrational portion 12. The connecting electrode 20 is disposed on an etched face which is formed by an etching process for connecting the exciting electrode 17 and the other exciting electrode 21 (not shown) which is formed on a bottom face of the vibrational portion 12 in opposed relation to the front exciting electrode 18. In similar manner, the front exciting electrode 18 is connected to the rear exciting electrode 22 (not shown) formed in opposed relation to the front exciting electrode 17, through the other connecting electrode 19 formed on the etched face. The pair of exciting electrodes 17, 18 of opposite polarities are extended along the frame 15 to the mount 16 for external electrical connection. An alternating voltage is applied between the end terminals of the pair of exciting electrodes 17, 18 to efficiently induce a torsional vibration. By such construction of the resonator, the series resistance $R_1$ can be lowered, while the vibrational energy can be confined efficiently within the vibrational portion 12, thereby providing an improved quartz crystal resonator having excellent electric characteristics, free of vibrational leak. Further, though the inventive resonator has a rather complicated shape, the resonator can be formed easily by chemical etching.

FIG. 8 shows the relation between the piezoelectric constant $e_{16}$ and the cut angle $\phi$ while the other cut angle $\theta$ is set as a parameter. As seen from the graph, the piezoelectric constant $e_{16}$ becomes zero at $\theta=0°$ in the entire range of the cut angle $\phi$, hence and the present torsional quartz crystal resonator can not be excited. However, the absolute value of $e_{16}$ gradually increases as the cut angle $\theta$ increases, so that the constant $e_{16}$ has a maximum value at $\theta = 30°$. Though not shown in the figure, when the cut angle $\theta$ is further increased, the absolute value of $e_{16}$ reversely and gradually decreases so that the absolute value of $e_{16}$ becomes minimum at $\theta = 60°$. When the cut angle $\theta$ is still further increased, the absolute value of $e_{16}$ again increases. As understood from the above description, the torsional quartz crystal resonator having the cut angle $\theta = 0°$ is not excited by the inventive electrode structure. Further, the absolute value of $e_{16}$ is extremely small in the cut angle range below $\theta = 10°$, hence the series resistance $R_1$ is rather great and is therefore not practical. Accordingly, the absolute cut angle $\theta$ is set not less than 10° so as to lower the series resistance $R_1$ in the invention.

Figure 9:
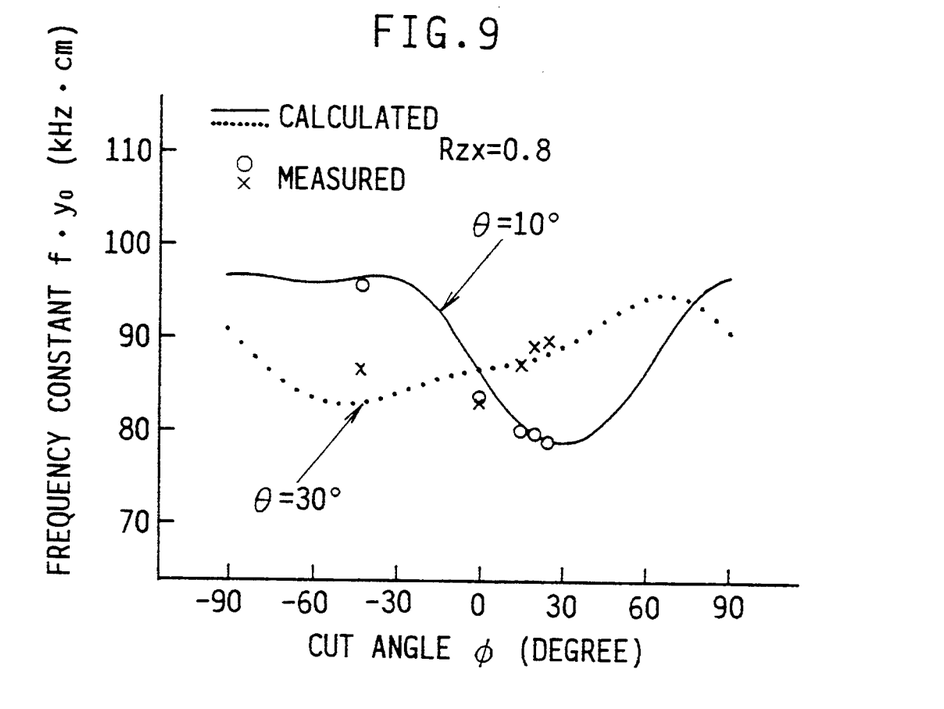
FIG. 9 is a graph showing the relation between the cut angle $\phi$ and the frequency constant $f \cdot y_0$, where the other cut angle $\theta$ is set as a parameter in the inventive torsional quartz crystal resonator of the tuning fork type.

Next, the description is given for micronization of the resonator. FIG. 9 shows the relation between the cut angle $\phi$ and the frequency constant $f.y_0$ with respect to the inventive tuning fork type torsional quartz crystal resonator having the thickness-to-width ratio $R_{zx} = 0.8$, where the other cut angle $\theta$ is set as a parameter. Although depending on the values of the cut angles $\phi$, $\theta$, the frequency constant ranges from 80 to 97 kHz.cm, which is greater than the typical value of 7.9 kHz.cm of the conventional tuning fork type flexural quartz crystal resonator having the thickness-to-width ratio of 0.1, and which is smaller than the typical value of 270 kHz.cm of the conventional length extensional mode quartz crystal resonator. Namely, the frequency constant of the inventive tuning fork type torsional quartz crystal resonator ranges between those of the flexural mode and the length extensional mode, so that the inventive resonator is particularly suitable for use in the frequency range from 200 kHz to 600 kHz.

Next, the description is given for the typical electrical equivalent circuit parameters of the inventive tuning fork type torsional quartz crystal resonator. Table 1 shows the typical parameters with respect to different samples of the inventive tuning fork type torsional quartz crystal resonator, having the cut angles $\phi = 0°$, $\theta = 30°$ and the other cut angles $\phi = 26°$, $\theta = 10°$. In case of $\phi = 0°$ and $\theta = 30°$, the following data are obtained: frequency $f = 444.1$ kHz, $R_1 = 2.2$ k$\Omega$ and $Q = 378,000$. On the other hand, in case of $\phi = 26°$, $\theta = 10°$, the following data are obtained: $f = 385.8$ kHz, $R_1 = 14.4$ k$\Omega$ and $Q = 276,000$. Accordingly, there can be obtained a resonator having a small value of $R_1$ and great value of Q. Further, it is understood from the value of $e_{16}$ that the excellent $R_1$ and Q values can be obtained in the various cut angle ranges of $\phi$ and $\theta$ besides the listed samples.

perature coefficient $\alpha$ is made zero to thereby achieve excellent frequency temperature behavior.

(2) Particularly, the cut angles $\phi$, $\theta$ and the thickness-to-width ratio $R_{zx}$ are optimumly set to reduce the second order temperature coefficient $\beta$ by about one-third of the conventional tuning type flexural mode quartz crystal resonator, thereby reducing variation of the frequency relative to the temperature as compared to the flexural mode and the length extensional mode.

(3) The inventive resonator can be formed easily by an etching process when the cut angle $\phi$ ranges from $-55°$ to $+30°$ and the other cut angle $\theta$ ranges $\pm(10°$ through 80°), thereby reducing the size and the thickness of the resonator. Additionally, a plurality of resonator pieces can be produced at once by the batch processing of one wafer, thereby lowering the production cost.

(4) The inventive resonator has a frequency range between the fundamental vibration mode of the tuning type flexural quartz crystal resonator and the length extensional mode quartz crystal resonator, thereby making the inventive resonator particularly suitable to the range of 200 kHz through 600 kHz.

(5) The invention can facilitate the micronization of the quartz crystal resonator.

(6) The exciting electrodes are disposed on the top and bottom faces of the resonator piece, thereby decreasing the series resistance $R_1$ and increasing the Q value of the torsional quartz crystal resonator.

(7) The inventive resonator can be shaped as the tuning fork type or the free-free bar type such that the vibrational portion can be formed integrally with the supporting portion, thereby reducing a loss of vibrational energy which would be otherwise caused by lead wires, to produce a torsional quartz crystal resonator having good shock resistance.

What is claimed is:

1. A torsional quartz crystal tuning fork resonator vibratable in a torsional mode, the resonator having a specific cut type defined such that a Z plate quartz crystal normal to a z-axis (optical axis) and having its length extending along a y-axis (mechanical axis) is rotated around an x-axis (electrical axis) by a cut angle $\phi$ in the range of 0° through $+30°$, and is further rotated around a resultant z'-axis (new z-axis) by another cut angle $\theta$ in the range of $-20°$ through $-10°$ or $+10°$ through $+20°$ so as to form the torsional quartz crystal tuning fork resonator, the resonator having a thickness-to-width ratio $R_{zx} = z_0/x_0$ within the range of 0.6 through 1.1, and the resonator having a first order temperature coefficient $\alpha$ of approximately zero around room temperature.

2. A torsional quartz crystal tuning fork resonator

TABLE 1

| $\phi$ (DEG.) | $\theta$ (DEG.) | f (kHz) | $R_1$ (k$\Omega$) | $L_1$ (kH) | Q ($\times 10^3$) | $C_0$ (pF) | r |
| --- | --- | --- | --- | --- | --- | --- | --- |
| 0 | 30 | 444.1 | 2.2 | 0.30 | 378 | 0.425 | 984 |
| 26 | 10 | 385.8 | 14.4 | 1.64 | 276 | 0.434 | 4190 |

As described above, the inventive torsional quartz crystal resonator of the TT cut can produce the following remarkable effects:

(1) The cut angle $\phi$ is set in the range from $-90°$ to $+90°$, the other cut angle $\theta$ is set in the range of $\pm(10°$ through 80°) and the thickness-to-width ratio $R_{zx}$ is set in the range of 0.1 through 1.5, such that the first temaccording to claim 1; including an excitation electrode disposed on a given face of the resonator, which is normal to the z' axis.

3. A torsional quartz crystal tuning fork resonator vibratable in a torsional mode, comprising: a vibrational portion having a tuning fork shape having top and bottom faces; a bridge portion connected to an intermediate part of the vibrational portion; a supporting portion connected to the bridge portion and having a mount on an end of the supporting portion; and a pair of excitation electrodes of opposite polarities disposed on at least one of the top and bottom faces of the vibrational portion adjacent to one another; wherein the resonator is formed from a quartz crystal plate which is defined by rotating a Z plate around an x-axis at an angle in the range of 0° through +30° and by further rotating the same around a z'-axis at another angle in the range of −20° through −10° or +10° through 20°, the resonator having a thickness-to-width ratio $R_{zx} = z_0/x_0$ within the range of 0.6 through 1.1, and the resonator having a first order temperature coefficient $\alpha$ of approximately zero around room temperature.

4. A torsional quartz crystal tuning fork resonator according to claim 3; wherein the vibrational portion and the support portion are formed integrally with one another by chemical etching of the Z plate.

5. A torsional quartz crystal tuning fork resonator according to claim 3; including a connecting electrode arranged on an etched side face of the vibrational portion for forming a connection between excitation electrodes disposed on top and bottom faces of the vibrational portion.

6. A torsional quartz crystal tuning fork resonator, comprising: a tuning fork having a plurality of tines vibratable in a torsional mode of vibration during use of the resonator, the tuning fork comprising a quartz crystal Z-cut plate having x, y and z axes corresponding, respectively, to the electrical, mechanical and optical axes of the quartz crystal, the plate having a length defined along the y-axis, a width $x_0$ defined along the x-axis and a thickness $z_0$ defined along the z-axis, the fork tines extending lengthwise along the y-axis, and the cut of the plate being defined by rotation of the plate through a first cut angle in the range of 0° through +30° around the x-axis thereby defining new x', y' and z' axes, and rotation of the plate through a second cut angle in the range of −20° through −10° or +10° through +20° around the z' axis to form a quartz crystal tuning fork resonator having a thickness-to-width ratio $R_{zx} = z_0/x_0$ within the range of 0.6 through 1.1 and having a first order temperature coefficient $\alpha$ of approximately zero around room temperature.

7. A torsional quartz crystal tuning fork resonator, comprising: a quartz crystal Z-cut plate having x, y and z axes corresponding to the electrical, mechanical and optical axes, respectively, of the quartz crystal, the cut of the plate being defined by rotation of the plate around the x-axis through an angle in the range 0° through +30° thereby defining new x', y' and z' axes and by rotation of the plate around the z'-axis through an angle in the range −20° through −10° or +10° through +20°, the plate having a vibrational portion having a tuning fork shape and being vibratable in a torsional mode of vibration, a supporting portion for supporting the resonator, and a bridge portion interconnecting the vibrational and supporting portions such that the vibrational portion can undergo torsional mode vibration relative to the supporting portion during use of the resonator, the resonator having a thickness-to-width ratio $R_{zx} = z_0/x_0$ within the range of 0.6 through 1.1, and the resonator having a first order temperature coefficient $\alpha$ of approximately zero around room temperature.

8. A torsional quartz crytal tuning fork resonator according to claim 7; including electrodes on the vibrational, supporting and bridge portions for exciting the vibrational portion into torsional mode vibration.

9. A torsional quartz crystal tuning fork resonator according to claim 7; wherein the bridge portion is connected to the vibrational portion at an intermediate position therealong.

10. A torsional quartz crystal tuning fork resonator according to claim 7; wherein the vibrational, supporting and bridge portions comprise chemically etched portions of the Z-cut plate.

11. A torsional quartz crystal tuning fork resonator according to claim 1; wherein the resonator has a second order temperature coefficient $\beta$ in the range of $-2.6$ through $-1.2 \times 10^{-8}/°C.^2$.

12. A torsional quartz crystal tuning fork resonator according to claim 3; wherein the resonator has a second order temperature coefficient $\beta$ in the range of $-2.6$ through $-1.2 \times 10^{-8}/°C.^2$.

13. A torsional quartz crystal tuning fork resonator according to claim 6; wherein the resonator has a second order temperature coefficient $\beta$ in the range of $-2.6$ through $-1.2 \times 10^{-8}/C.^2$.

14. A torsional quartz crystal tuning fork resonator according to claim 7; wherein the resonator has a second order temperature coefficient $\beta$ in the range of $-2.6$ through $-1.2 \times 10^{-8}/°C.^2$.

* * * * *